United States Patent
Hall et al.

(10) Patent No.: US 7,253,671 B2
(45) Date of Patent: Aug. 7, 2007

(54) APPARATUS AND METHOD FOR COMPENSATING FOR CLOCK DRIFT IN DOWNHOLE DRILLING COMPONENTS

(75) Inventors: David R. Hall, Provo, UT (US); David S. Pixton, Lehi, UT (US); Monte L. Johnson, Orem, UT (US); David B. Bartholomew, Springville, UT (US); H. Tracy Hall, Jr., Provo, UT (US)

(73) Assignee: IntelliServ, Inc., Provo, UT (US)

( * ) Notice: Subject to any disclaimer, the term of this patent is extended or adjusted under 35 U.S.C. 154(b) by 0 days.

(21) Appl. No.: 10/878,147

(22) Filed: Jun. 28, 2004

(65) Prior Publication Data

US 2005/0285645 A1  Dec. 29, 2005

(51) Int. Cl.
*H03K 5/01* (2006.01)

(52) U.S. Cl. .................. 327/165; 327/162; 327/378

(58) Field of Classification Search ........ 327/165–167, 327/141, 154, 155, 160, 162, 378
See application file for complete search history.

(56) References Cited

U.S. PATENT DOCUMENTS

| | | | | |
|---|---|---|---|---|
| 2,414,719 A | 1/1947 | Cloud | .................. | 333/177 |
| 3,505,478 A | 4/1970 | Kaneko | .................. | 370/518 |
| 3,518,608 A | 6/1970 | Papadopoulos | .......... | 439/191 |
| 4,055,814 A | 10/1977 | Abraham | .................. | 331/19 |
| 4,124,820 A | 11/1978 | Arnstein | .................. | 327/166 |
| 4,165,490 A | 8/1979 | Howe, Jr. et al. | .......... | 327/172 |
| 4,386,323 A | 5/1983 | Jansen | .................. | 327/152 |
| 4,560,939 A | 12/1985 | DeKarske et al. | .......... | 327/145 |
| 4,602,375 A | 7/1986 | Inukai | .................. | 375/358 |
| 4,739,325 A | 4/1988 | MacLeod | .............. | 340/854.4 |
| 4,788,544 A | 11/1988 | Howard | .................. | 340/853.7 |
| 4,868,514 A | 9/1989 | Azevedo et al. | .......... | 327/159 |
| 5,604,468 A * | 2/1997 | Gillig | .................. | 331/176 |
| 5,834,987 A * | 11/1998 | Dent | .................. | 332/127 |
| 5,856,766 A * | 1/1999 | Gillig et al. | ............. | 331/176 |
| 5,859,881 A | 1/1999 | Ferraiolo et al. | ........... | 375/350 |

(Continued)

OTHER PUBLICATIONS

PCT/US03/18475, Published Dec. 4, 2003, Applicant Beker Hughes; International Search Report "Documents Considered to Be Relevant".

*Primary Examiner*—Kenneth B. Wells
*Assistant Examiner*—Hai L Nguyen
(74) *Attorney, Agent, or Firm*—Daniel P. Nelson; Tyson J. Wilde; Jeffrey E. Daly

(57) ABSTRACT

A precise downhole clock that compensates for drift includes a prescaler configured to receive electrical pulses from an oscillator. The prescaler is configured to output a series of clock pulses. The prescaler outputs each clock pulse after counting a preloaded number of electrical pulses from the oscillator. The prescaler is operably connected to a compensator module for adjusting the number loaded into the prescaler. By adjusting the number that is loaded into the prescaler, the timing may be advanced or retarded to more accurately synchronize the clock pulses with a reference time source. The compensator module is controlled by a counter-based trigger module configured to trigger the compensator module to load a value into the prescaler. Finally, a time-base logic module is configured to calculate the drift of the downhole clock by comparing the time of the downhole clock with a reference time source.

19 Claims, 10 Drawing Sheets

U.S. PATENT DOCUMENTS

| | | | |
|---|---|---|---|
| 6,012,015 A | 1/2000 | Tubel | 702/6 |
| 6,130,925 A * | 10/2000 | Ichimaru et al. | 375/376 |
| 6,236,278 B1 * | 5/2001 | Olgaard | 331/25 |
| 6,249,235 B1 * | 6/2001 | Iwasaki | 341/123 |
| 6,252,518 B1 | 6/2001 | Laborde | 340/855.4 |
| 6,308,049 B1 * | 10/2001 | Bellaouar et al. | 455/76 |
| 6,359,950 B2 * | 3/2002 | Gossmann et al. | 375/376 |
| 6,392,317 B1 | 5/2002 | Hall et al. | 307/190 |
| 6,504,498 B1 * | 1/2003 | O'Brien | 341/143 |
| 6,515,553 B1 * | 2/2003 | Filiol et al. | 332/127 |
| 6,556,087 B2 * | 4/2003 | Ichimaru | 331/10 |
| 6,600,378 B1 * | 7/2003 | Patana | 331/1 A |
| 6,639,475 B2 * | 10/2003 | Ichimaru | 331/17 |
| 6,661,267 B2 | 12/2003 | Walker et al. | 327/159 |
| 6,670,880 B1 | 12/2003 | Hall et al. | 366/432 |
| 6,688,396 B2 | 2/2004 | Floerke et al. | 166/380 |
| 6,710,951 B1 * | 3/2004 | Cloke | 360/29 |
| 6,711,230 B1 | 3/2004 | Nicholls et al. | 375/376 |
| 6,717,501 B2 | 4/2004 | Hall et al. | 366/432 |
| 6,799,632 B2 | 10/2004 | Hall et al. | 166/207 |
| 6,821,147 B1 | 11/2004 | Hall et al. | 439/581 |
| 6,830,467 B2 | 12/2004 | Hall et al. | 439/194 |
| 6,844,498 B2 | 1/2005 | Hall et al. | 174/75 C |
| 6,844,836 B1 * | 1/2005 | Lee | 341/143 |
| 6,866,306 B2 | 3/2005 | Boyle et al. | 285/333 |
| 6,888,473 B1 | 5/2005 | Hall et al. | 346/854.4 |
| 6,913,093 B2 | 7/2005 | Hall et al. | 175/57 |
| 6,929,493 B2 | 8/2005 | Hall et al. | 439/191 |
| 6,945,802 B2 | 9/2005 | Hall et al. | 439/194 |
| 2004/0039468 A1 | 2/2004 | Lilly et al. | 700/95 |
| 2004/0104797 A1 | 6/2004 | Hall et al. | 336/12 |
| 2004/0113608 A1 | 6/2004 | Hall et al. | 340/854.3 |
| 2004/0145492 A1 | 7/2004 | Hall et al. | 340/854.3 |
| 2004/0150632 A1 | 8/2004 | Hall et al. | 340/854.3 |
| 2004/0164833 A1 | 8/2004 | Hall et al. | 336/132 |
| 2004/0164838 A1 | 8/2004 | Hall et al. | 336/234 |
| 2004/0216847 A1 | 11/2004 | Hall et al. | 165/575 |
| 2004/0244916 A1 | 12/2004 | Hall et al. | 156/574 |
| 2004/0244964 A1 | 12/2004 | Hall et al. | 166/65.1 |
| 2004/0246142 A1 | 12/2004 | Hall et al. | 340/854.9 |
| 2005/0001735 A1 | 1/2005 | Hall et al. | 340/853.7 |
| 2005/0001736 A1 | 1/2005 | Hall et al. | 340/854.1 |
| 2005/0001738 A1 | 1/2005 | Hall et al. | 340/854.8 |
| 2005/0035874 A1 | 2/2005 | Hall et al. | 340/853.1 |
| 2005/0035875 A1 | 2/2005 | Hall et al. | 340/853.1 |
| 2005/0035876 A1 | 2/2005 | Hall et al. | 340/854.1 |
| 2005/0036507 A1 | 2/2005 | Hall et al. | 370/463 |
| 2005/0039912 A1 | 2/2005 | Hall et al. | 166/242.6 |
| 2005/0045339 A1 | 3/2005 | Hall et al. | 166/380.166 |
| 2005/0046588 A1 | 3/2005 | Hall et al. | 340/853.4 |
| 2005/0048590 A1 | 3/2005 | Hall et al. | 340/854.8 |
| 2005/0067159 A1 | 3/2005 | Hall et al. | 166/65.1 |
| 2005/0070144 A1 | 3/2005 | Hall et al. | 439/191 |
| 2005/0082092 A1 | 4/2005 | Hall et al. | 175/325.1 |
| 2005/0092499 A1 | 5/2005 | Hall et al. | 166/380 |
| 2005/0093296 A1 | 5/2005 | Hall et al. | 285/288.1 |
| 2005/0095827 A1 | 5/2005 | Hall et al. | 438/578 |
| 2005/0115717 A1 | 6/2005 | Hall et al. | 166/380 |
| 2005/0145406 A1 | 7/2005 | Hall et al. | 174/37 |
| 2005/0150853 A1 | 7/2005 | Hall et al. | 166/178 |
| 2005/0161216 A1 | 7/2005 | Hall et al. | 166/242.6 |
| 2005/0173128 A1 | 8/2005 | Hall et al. | 166/380 |
| 2005/0212530 A1 | 9/2005 | Hall et al. | 324/647 |
| 2005/0236160 A1 | 10/2005 | Hall et al. | 166/380 |

* cited by examiner

APPARATUS AND METHOD FOR COMPENSATING FOR CLOCK DRIFT IN DOWNHOLE DRILLING COMPONENTS

U.S. GOVERNMENT INTEREST

This invention was made with government support under Contract No. DE-FC26-01NT41229 awarded by the U.S. Department of Energy. The government has certain rights in the invention.

FIELD OF THE INVENTION

This invention relates to oil and gas drilling, and more particularly to apparatus and methods for compensating for clock drift in downhole drilling components.

BACKGROUND

The goal of accessing data from a drill string has been expressed for more than half a century. As exploration and drilling technology has improved, this goal has become more important in the industry for successful oil, gas, and geothermal well exploration and production. For example, to take advantage of the several advances in the design of various tools and techniques for oil and gas exploration, it would be beneficial to have real time data such as temperature, pressure, inclination, salinity, etc. Several attempts have been made to devise a successful system for accessing such drill string data. However, due to the complexity, expense, and unreliability of such systems, many attempts to create such a system have failed to achieve significant commercial acceptance.

In U.S. Pat. No. 6,670,880 issued to Hall et al., the inventors disclosed a "downhole transmission system" that overcomes many of the problems and limitations of the prior art. In the Hall patent, data is transmitted along the drill string in real time. This is accomplished by various transmission hardware components integrated directly into the drill string. The Hall patent allows various tools and sensors, located downhole, to communicate with surface equipment in real time.

One problem that has not been adequately addressed involves the time synchronization of downhole components. Time synchronization is important because with some tools and sensors, it is very important to know precisely when particular data is gathered or measured. For example, precisely synchronized clocks are very important when taking seismic measurements downhole. Downhole seismic surveys (also called borehole velocity surveys) are conducted by measuring the time for seismic waves, generated by a seismic impulse, to travel to sensors located at different depths or locations underground. In order to extract usable information (i.e. create useful seismic images or the like) from data gathered by these sensors, the data must be accurately time-stamped.

Synchronizing the time of downhole devices may be further complicated by the very nature of a downhole environment. For example, oscillators that form the basis for many clocks used in electronic equipment often vary in output frequency. Thus, clocks may gradually drift away from a desired reference time. This drift is worsened in downhole environments because extreme temperatures, whether hot or cold, often amplify fluctuations in oscillator frequency. Thus, clocks that provide adequate precision above the surface may be unsuitable in downhole drilling applications.

Accordingly, what are needed are accurate clocks that maintain their accuracy in downhole environments. What are further needed are apparatus and methods to more effectively compensate for drift in clocks utilizing conventional oscillators. Further needed are clocks that are sufficiently accurate for precision-demanding applications such as downhole seismic devices. Finally, what are needed are apparatus and methods for synchronizing downhole clocks with a reference time source.

SUMMARY OF THE INVENTION

In view of the foregoing, the present invention relates to apparatus and methods for providing accurate clocks that maintain their accuracy in downhole environments. The present invention further relates to apparatus and methods for effectively compensating for drift in clocks utilizing conventional oscillators. The invention further relates to clocks that are sufficiently accurate for precision-demanding applications such as downhole seismic devices. Finally, the present invention relates to apparatus and methods for synchronizing downhole clocks with a desired reference time source.

Consistent with the foregoing, and in accordance with the invention as embodied and broadly described herein, an apparatus for measuring and correcting drift in downhole clocks is disclosed in one aspect of the present invention as including a prescaler configured to receive electrical pulses from an oscillator. The prescaler is configured to output a series of clock pulses. The prescaler outputs each clock pulse after counting a preloaded number of electrical pulses from the oscillator. The prescaler is operably connected to a compensator module for adjusting the number loaded into the prescaler. By adjusting the number that is loaded into the prescaler, the timing may be advanced or retarded to more accurately synchronize the clock pulses with a reference time source. The compensator module is controlled by a counter-based trigger module configured to trigger the compensator module to load a value into the prescaler. Finally, a time-base logic module is configured to calculate the drift of the downhole clock by comparing the time of the downhole clock with a reference time source.

In another aspect of the invention, a method for measuring and correcting drift in a downhole clock includes receiving electrical pulses from an oscillator and outputting a series of electrical clock pulses. As previously described, each clock pulse is output after counting a preloaded number of electrical pulses from the oscillator. The method further includes keeping time based on the electrical clock pulses, calculating the time drift by comparing the time with a reference time source, and compensating for the time drift by periodically adjusting the preloaded number.

In another aspect of the invention, an apparatus for measuring and correcting drift in a downhole clock includes a prescaler configured to receive pulses from an oscillator and output a series of clock pulses. Each clock pulse output by the prescaler corresponds to a preloaded number of pulses from the oscillator. The prescaler is connected to a compensator module configured to adjust the preloaded number. The compensator module is controlled by a trigger module, which is configured to trigger the compensator module to adjust the preloaded number. Finally, a time-base logic module is configured to control the trigger module to compensate for drift by the series of clock pulses.

BRIEF DESCRIPTION OF THE DRAWINGS

The foregoing and other features of the present invention will become more fully apparent from the following description, taken in conjunction with the accompanying drawings. Understanding that these drawings depict only typical embodiments in accordance with the invention and are, therefore, not to be considered limiting of its scope, the invention will be described with additional specificity and detail through use of the accompanying drawings in which.

DETAILED DESCRIPTION OF THE INVENTION

It will be readily understood that the components of the present invention, as generally described and illustrated in the Figures herein, could be arranged and designed in a wide variety of different configurations. Thus, the following more detailed description of embodiments of apparatus and methods of the present invention, as represented in the Figures, is not intended to limit the scope of the invention, as claimed, but is merely representative of various selected embodiments of the invention.

The illustrated embodiments of the invention will be best understood by reference to the drawings, wherein like parts are designated by like numerals throughout. Those of ordinary skill in the art will, of course, appreciate that various modifications to the apparatus and methods described herein may easily be made without departing from the essential characteristics of the invention, as described in connection with the Figures.

Thus, the following description of the Figures is intended only by way of example, and simply illustrates certain selected embodiments consistent with the invention as claimed herein.

Many of the functional units described in this specification have been labeled as modules in order to more particularly emphasize their implementation independence. For example, modules may be implemented in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. For example, a module of executable code could be a single instruction, or many instructions, and may even be distributed over several different code segments, among different programs, and across several memory devices.

Modules may also be implemented in hardware as electronic circuits comprising custom VLSI circuitry, off-the-shelf semiconductors such as logic chips, transistors, or other discrete components. A module may also be implemented in programmable hardware devices such as field programmable gate arrays, programmable array logic, programmable logic devices, or the like. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Figure 1:
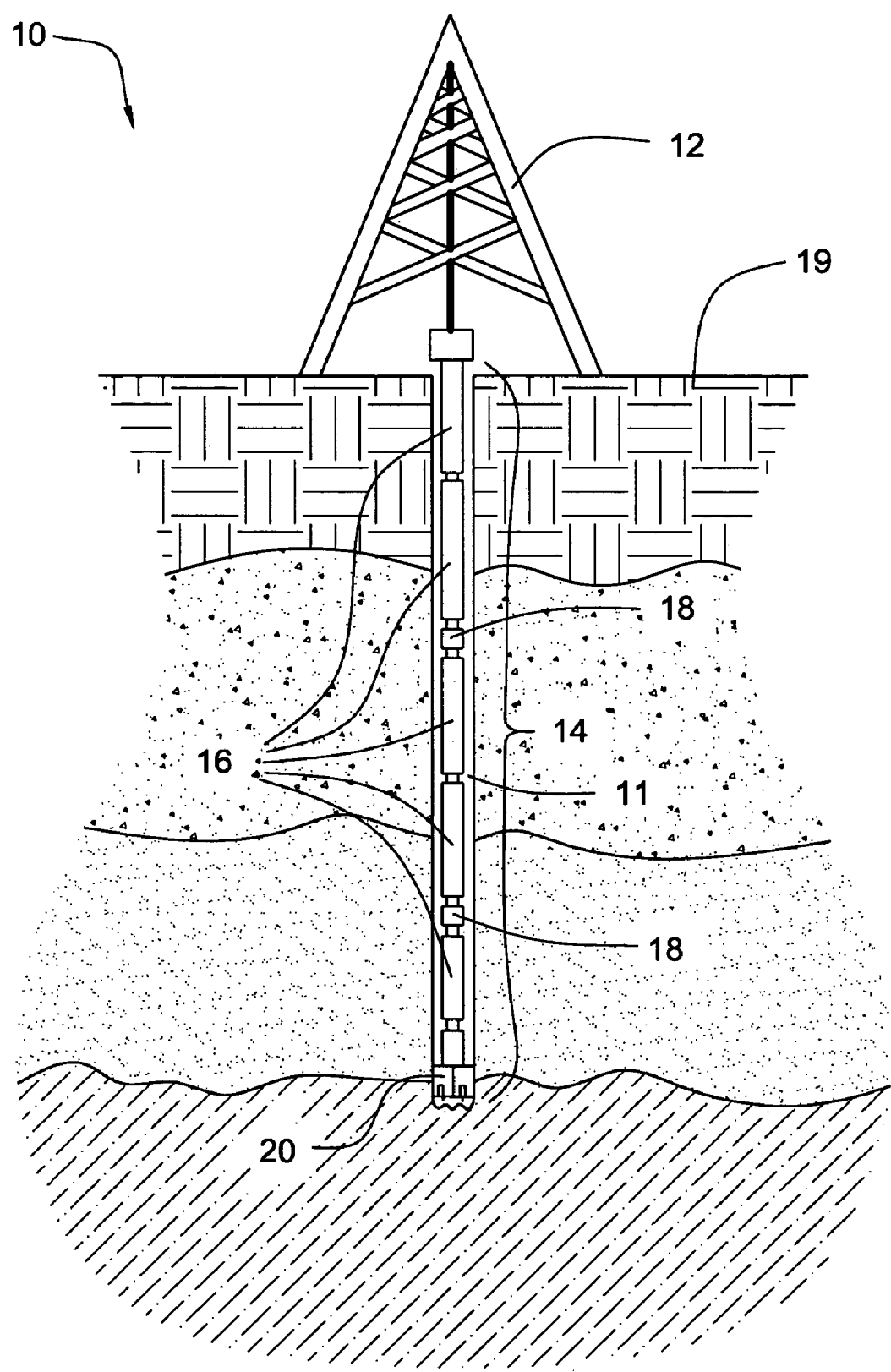
FIG. 1 is a profile view of one embodiment of a drill rig and drill string in accordance with the invention.

Referring to FIG. 1, a drill rig 10 may include a derrick 12 and a drill string 14 comprised of multiple sections of drill pipe 16 and other downhole tools. The drill string 14 is typically rotated by the drill rig 10 to turn a drill bit 20 that is loaded against the earth 19 to form a borehole 11. Rotation of the drill bit 20 may alternately be provided by other downhole tools such as drill motors, or drill turbines (not shown) located adjacent to the drill bit 20.

A bottom-hole assembly may include a drill bit 20, sensors, and other downhole tools such as logging-while-drilling ("LWD") tools, measurement-while-drilling ("MWD") tools, diagnostic-while-drilling ("DWD") tools, or the like. Other downhole tools may include heavyweight drill pipe, drill collar, stabilizers, hole openers, sub-assemblies, under-reamers, rotary steerable systems, drilling jars, drilling shock absorbers, and the like, which are all well known in the drilling industry.

While drilling, a drilling fluid is typically supplied under pressure at the drill rig 10 through the drill string 14. The drilling fluid typically flows downhole through the central bore of the drill string 14 and then returns uphole to the drill rig 10 through the annulus 11. Pressurized drilling fluid is circulated around the drill bit 20 to provide a flushing action to carry the drilled earth cuttings to the surface.

Figure 2:
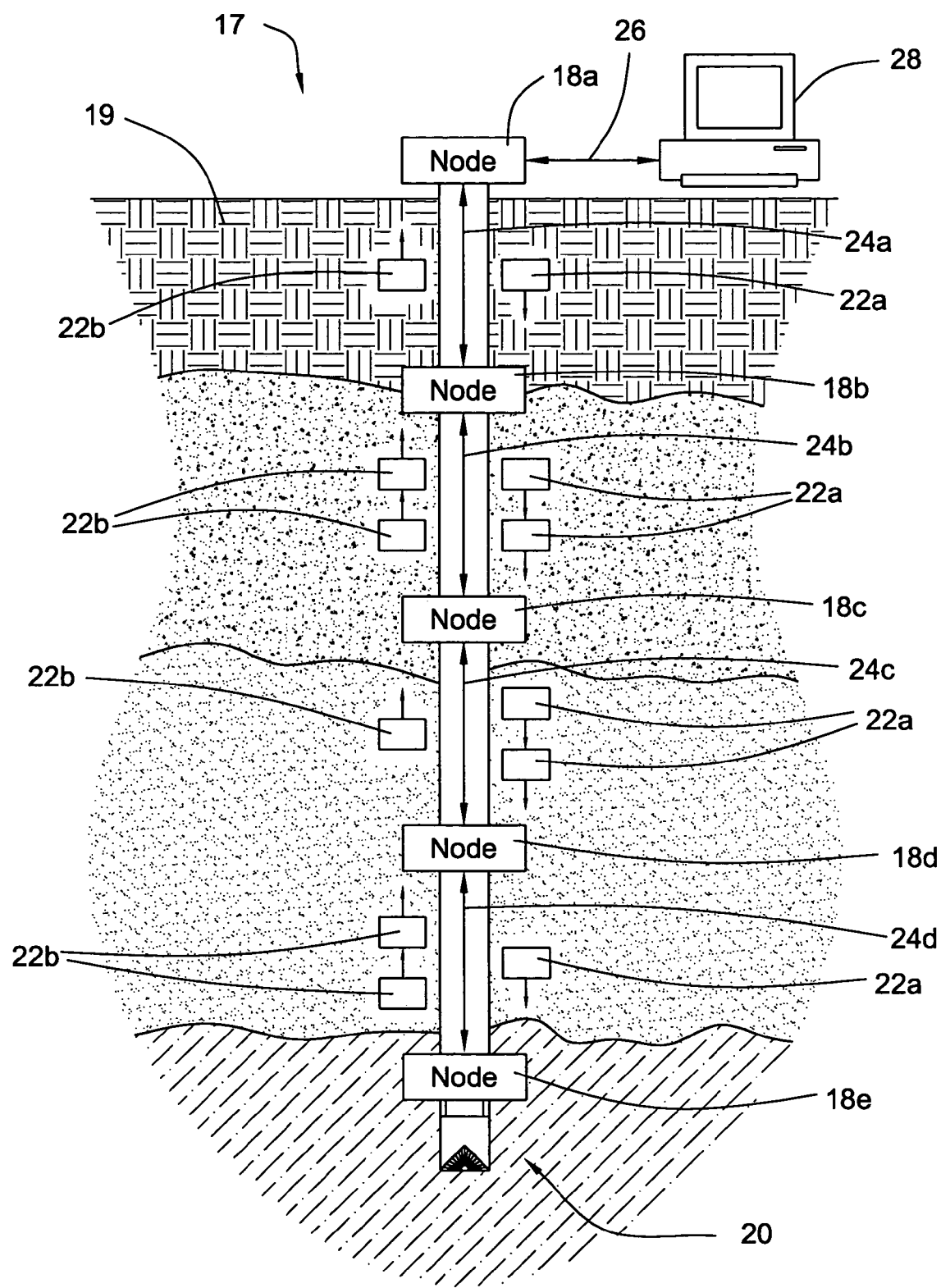
FIG. 2 is a schematic diagram illustrating one embodiment of a downhole network in accordance with the invention, integrated into the drill string.

Referring to FIG. 2, while continuing to refer generally to FIG. 1, in selected embodiments, a downhole network 17 may be used to transmit information along the drill string 14. The downhole network 17 may include multiple nodes 18a-e spaced at desired intervals along the drill string 14. The nodes 18a-e may be intelligent computing devices 18a-e, such as routers, or may be less intelligent connection devices, such as hubs, switches, repeaters, or the like, located along the length of the network 17. Each of the nodes 18 may or may not have a network address. A node 18e may be located at or near the bottom hole assembly. The bottom hole assembly may include a drill bit 20, drill collar, and other downhole tools and sensors designed to gather data, perform various functions, or the like.

Other intermediate nodes 18b-d may be located or spaced along the network 17 to act as relay points for signals traveling along the network 17 and to interface to various tools or sensors located along the length of the drill string 14. Likewise, a top-hole node 18a may be positioned at the top or proximate the top of the drill string 14 to interface to an analysis device 28, such as a personal computer 28.

Communication links 24a-d may be used to connect the nodes 18a-e to one another. The communication links 24a-d may consist of cables or other transmission media integrated directly into the tools comprising the drill string 14, routed through the central bore of the drill string 14, or routed externally to the drill string 14. Likewise, in certain embodiments, the communication links 24a-d may be wireless connections. In selected embodiments, the downhole network 17 may function as a packet-switched or circuit-switched network 17.

To transmit data along the drill string 14, packets 22a, 22b may be transmitted between the nodes 18a-e. The packets 22b may carry data gathered by downhole tools or sensors to uphole nodes 18a, or may carry protocols or data necessary to the function of the network 17. Likewise, some packets 22a may be transmitted from uphole nodes 18a to downhole nodes 18b-e. For example, these packets 22a may be used to carry control signals or programming data from a top-hole node 18a to tools or sensors interfaced to various downhole nodes 18b-e. Thus, a downhole network 17 may provide a high-speed means for transmitting data and information between downhole components and devices located at or near the earth's surface 19.

Figure 3:
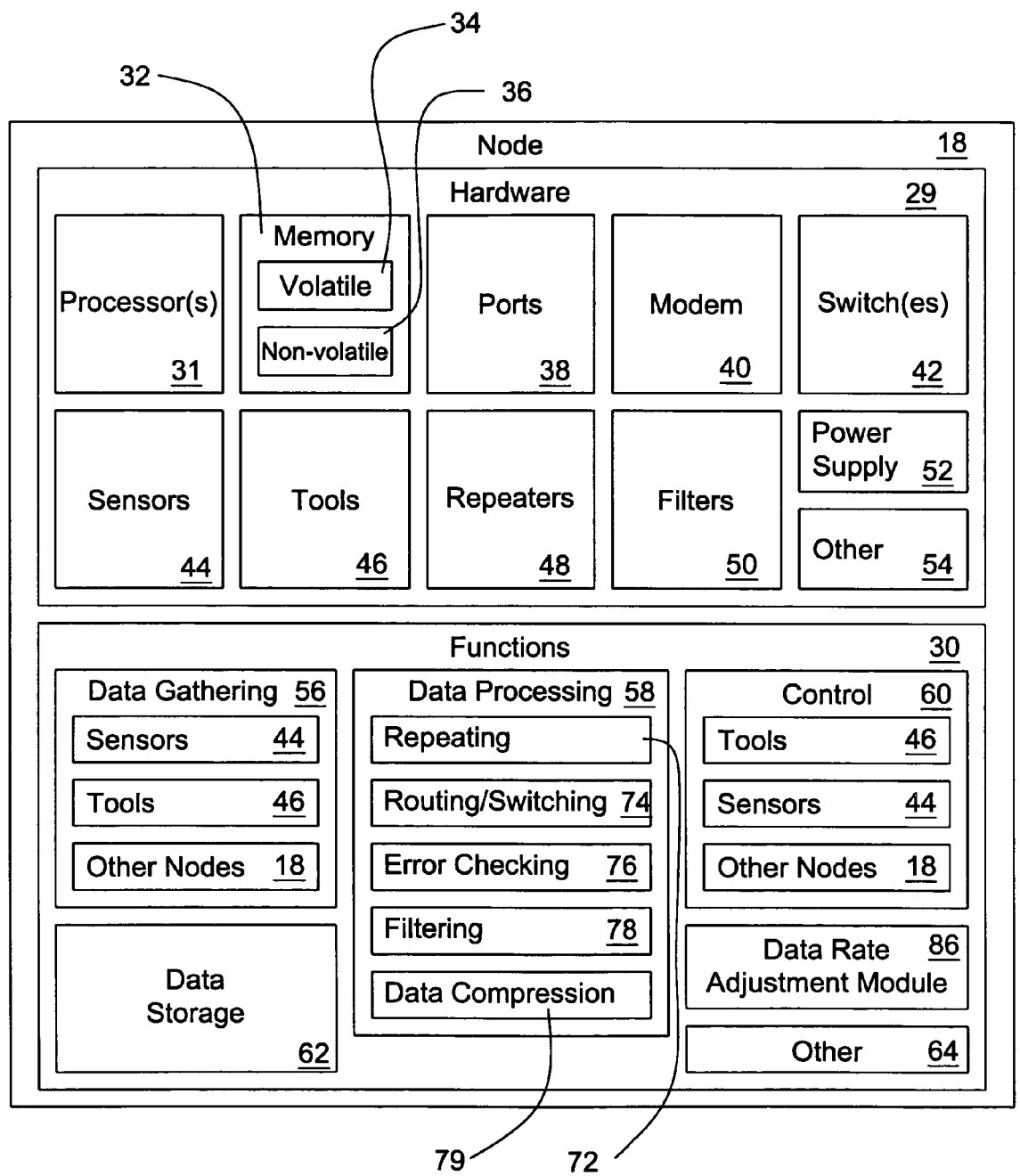
FIG. 3 is a schematic block diagram illustrating various types of hardware and software modules that may be included in a network node in accordance with the invention.

Referring to FIG. 3, a network node 18 in accordance with the invention may include a combination of hardware 29 and software providing various functions 30. The functions 30 may be provided strictly by the hardware 29, software executable on the hardware 29, or a combination thereof. For example, hardware 29 may include one or several processors 31 capable of processing data as well as executing instructions. The processor 31 or processors 31 may include hardware such as busses, clocks, cache, or other supporting hardware.

Likewise, the hardware 29 may include volatile 34 and non-volatile 36 memories 32 to store data and provide staging areas for data transmitted between hardware components 29. Volatile memory 34 may include random access memory (RAM), or equivalents thereof, providing high-speed memory storage. Memory 32 may also include selected types of non-volatile memory 36 such as read-only-memory (ROM), PROM, EEPROM, or the like, or other long-term storage devices, such as hard drives, floppy disks, flash memory, or the like. Ports 38 such as serial ports, parallel ports, or the like may be used to interface to other devices connected to the node 18, such as various sensors or tools located proximate the node 18.

A modem 40 may be used to modulate digital data onto an analog carrier signal for transmission over network cable or other transmission media, and likewise, demodulate the analog signals when received. A modem 40 may include various built in features including but not limited to error checking, data compression, or the like. In addition, the modem 40 may use any suitable modulation type such as ASK, PSK, QPSK, OOK, PCM, FSK, QAM, PAM, PPM, PDM, PWM, or the like, to name a few. The choice of a modulation type may depend on a desired data transmission speed, the bandwidth capability of the network hardware, as well as unique operating conditions that may exist in a downhole environment. Likewise, the modem 40 may be configured to operate in full-duplex, half-duplex, or other mode. The modem 40 may also use any of numerous networking protocols currently available, such as collision-based protocols like Ethernet, token-based, or asynchronous transfer (ATM) protocols.

A node 18 may also include one or several switches 42. Switches 42 could comprise multiplexers or demultiplexers. A switch 42 may filter, forward, and route traffic on the network. Switches 42, comprising multiplexers and corresponding demultiplexers, may transmit multiple signals over a single communications line or a single channel. Any known protocol may be used to transmit information over the network 17, including but not limited to frequency-division multiplexing, time-division multiplexing, statistical time-division multiplexing, wave-division multiplexing, code-division multiplexing, spread spectrum multiplexing, or a combination thereof.

A node 18 may also include various downhole tools 46 and sensors 44. These tools 46 and sensors 44 may be integrated into the node 18 (i.e. share the same circuitry) or interface to the node 18 through ports 38. Tools 46 and sensors 44 may include devices such as coring tools, mud logging devices, pore fluid sensors, resistivity sensors, induction sensors, sonic devices, radioactivity sensors, electrical potential tools, temperature sensors, accelerometers, imaging devices, seismic devices, mechanical devices such as caliper tools or free point indicators, pressure sensors, inclinometers, surveying tools, navigation tools, or the like. These tools 46 and sensors 44 may be configured to gather data for analysis uphole, and may also receive data such as control signals, programming data, or the like, from uphole sources. For example, control signals originating at the surface may direct a sensor 44 to take a desired measurement. Likewise, selected tools 46 and sensors 44 may be re-programmed through the network 17 without extracting the tools from the borehole.

A drill string 14 may extend into the earth 20,000 feet or more. As such, signal loss or attenuation may be a significant factor when transmitting data along the downhole network 17. This signal loss or attenuation may vary according to the network hardware. The reader is referred to U.S. Pat. No. 6,670,880 to Hall et al., incorporated herein by reference, for a description of one embodiment of various hardware components used to construct the network 17. For example, a drill string 14 is typically comprised of multiple segments of drill pipe 16 or other drill tools. As such, signal loss may occur each time a signal is transmitted from one downhole tool to another. Since a drill string may include several hundred sections of drill pipe 16 or other tools, the aggregate attenuation can be significant. Likewise, attenuation may also occur in the cable or other transmission media routed along the drill string 14.

To compensate for signal attenuation, repeaters 48 may be spaced at selected intervals along the network 17. According to one aspect of this invention, repeaters 48 could comprise amplifiers. The amplifiers 48 may receive a data signal, amplify it, and transmit it to the next node 18. Like amplifiers 48, repeaters 48 may be used to receive a data signal and retransmit it at higher power. However, unlike amplifiers 48, repeaters 48 may remove noise from the data signal. This may be done by demodulating the data from the transmitted signal and re-modulating it onto a fresh carrier.

Likewise, a node 18 may include various filters 50. Filters 50 may be used to filter out undesired noise, frequencies, and the like that may be present or introduced into a data signal traveling up or down the network 17. Likewise, the node 18 may include a power supply 52 to supply power to any or all of the hardware 29. The node 18 may also include other hardware 54, as needed, to provide other desired functionality to the node 18.

The node 18 may provide various functions 30 that are implemented by software, hardware, or a combination thereof. For example, the node's functions 30 may include data gathering 56, data processing 58, control 60, data storage 62, or other functions 64. Data may be gathered 56 from sensors 44 located downhole, tools 46, or other nodes 18 in communication with a selected node 18. This data may be transmitted or encapsulated within data packets transmitted up and down the network 17.

Likewise, the node 18 may provide various data processing functions 58. For example, data processing may include repeating 72, routing 74 or switching 74 data packets transmitted along the network 17, error checking 76 of data packets transmitted along the network 17, filtering 78 of data, as well as data compression 79 and decompression 79. The repeating function 72 could also comprise amplifying. Likewise, a node 18 may process various control signals 60 transmitted from the surface to tools 46, sensors 44, or other nodes 18 located downhole. Likewise, a node 18 may store data that has been gathered from tools 46, sensors 44, or other nodes 18 within the network 17. Likewise, the node 18 may include other functions 64, as needed.

In selected embodiments, a node 18 may include a data rate adjustment module 86. The data rate adjustment module 86 may monitor network traffic traveling in both uphole and downhole directions. The data rate adjustment module 86 may optimize the network's settings and efficiency by adjusting the allocation of bandwidth for data traveling uphole and downhole. As is typical in most communication systems, data rates may be limited by the available bandwidth of a particular system. For example, in downhole drilling systems, available bandwidth may be limited by the transmission cable, hardware used to communicate across tool joints, electronic hardware in the nodes 18, the downhole environment, or the like. Thus, the data rate adjustment module 86 may efficiently allocate the limited available bandwidth where it is most needed.

For example, in selected embodiments, most of the network traffic may flow from downhole tools 46 and sensors 44 to the surface for analysis. Thus, ordinarily, most of the network bandwidth may be allocated to traffic traveling uphole. Nevertheless, in some circumstances, more bandwidth may be needed for traffic traveling downhole. For example, in some cases, significant downhole bandwidth may be needed when reprogramming downhole tools 46 and sensors 44, or when sending large amounts of control data downhole. In these instances, the data rate adjustment module 86 may adjust the bandwidth to provide additional bandwidth to downhole traffic. In some instances, this may include reducing the allocated bandwidth for uphole traffic. Likewise, when the need for additional downhole bandwidth has abated, the data rate adjustment module 86 may readjust the available bandwidth by re-allocating bandwidth to uphole traffic.

Figure 4:
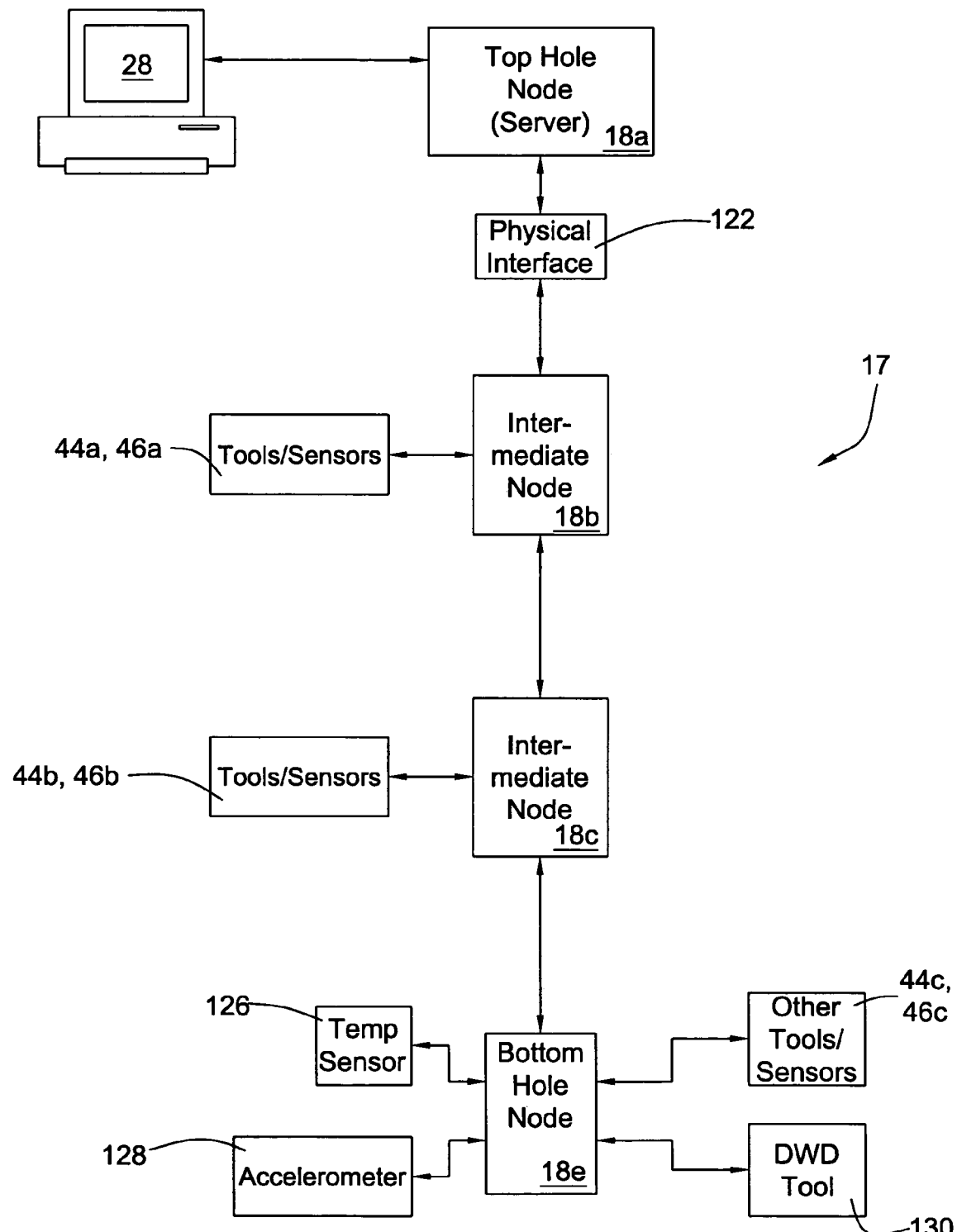
FIG. 4 is high-level schematic block diagram illustrating one embodiment of various tools and sensor interfacing with a network in accordance with the invention.

Referring to FIG. 4, in one embodiment, a downhole network 17 in accordance with the invention may include a top-hole node 18a and a bottom-hole node 18e. A bottom-hole node 18e may interface to various components located in or proximate a bottom-hole assembly. For example, a bottom-hole node 18e may interface to a temperature sensor 126, an accelerometer 128, a DWD (diagnostic-while-drilling) tool 130, or other tools 46c or sensors 44c such as those listed in the description of FIG. 3.

A bottom-hole node 18e may communicate with an intermediate node 18c located at an intermediate point along the drill string 14. The intermediate node 18c may also provide an interface to tools 46b or sensors 44b communicating through the network 17. Likewise, other nodes 18, such as a second intermediate node 18b, may be located along the drill string 14 to communicate with other sensors 44a or tools 46a. Any number of intermediate nodes 18b, 18c may be used along the network 17 between the top-hole node 18a and the bottom-hole node 18e.

In selected embodiments, a physical interface 122 may be provided to connect network components to a drill string 14. For example, since data may be transmitted directly up the drill string on cables or other transmission media integrated directly into drill pipe 16 or other drill string components, the physical interface 122 may provide a physical connection to the drill string so data may be routed off of the drill string 14 to network components, such as a top-hole node 18a, or personal computer 28.

For example, a top-hole node 18a may be operably connected to the physical interface 122. The top-hole node 18a may also be connected to an analysis or logging device 28 such as a personal computer 28. The personal computer 28 may be used to analyze or log data gathered from various downhole tools 46 or sensors 44.

Figure 5:
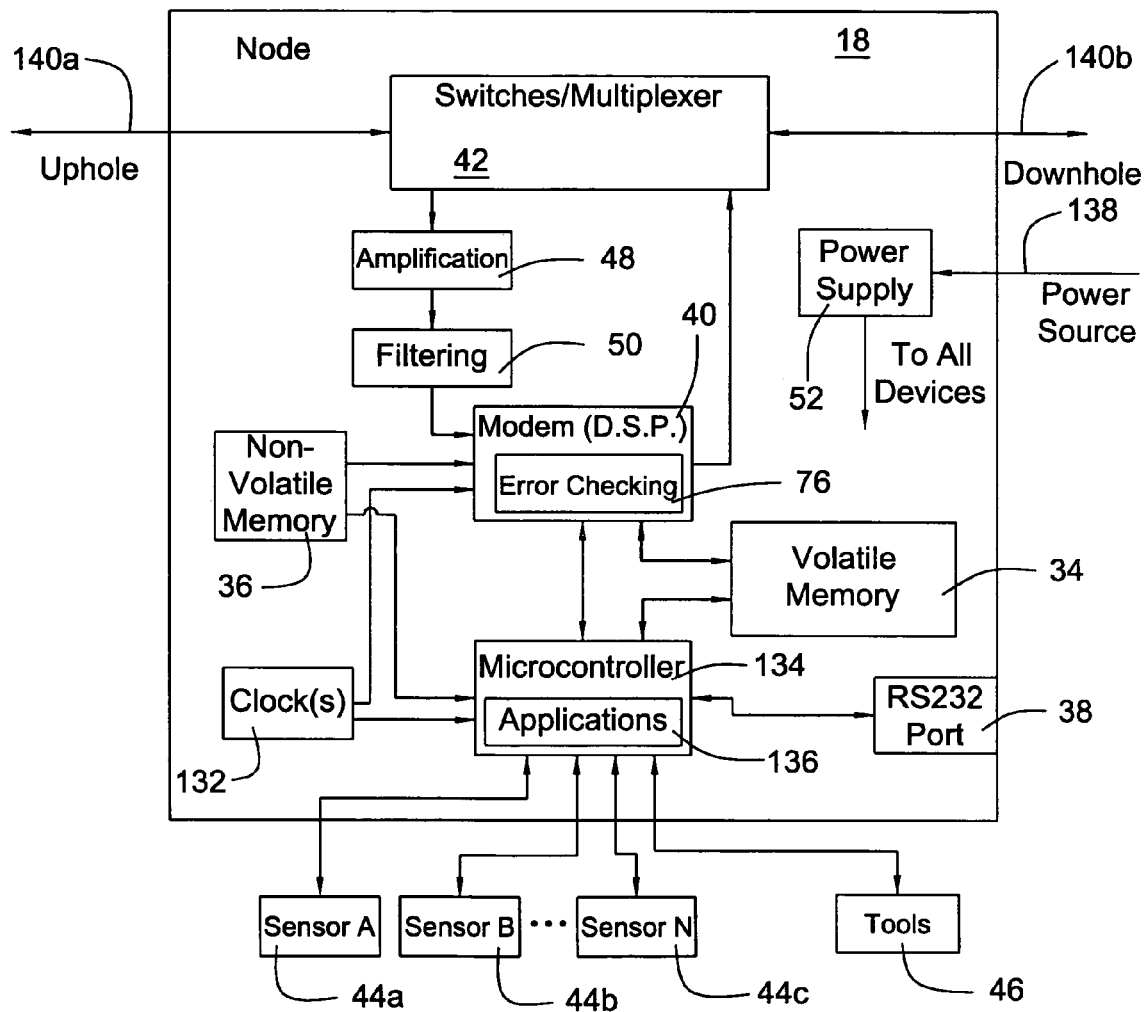
FIG. 5 is a schematic block diagram illustrating one embodiment of hardware and software components that may be included in a network node in accordance with the invention.

Referring to FIG. 5, in selected embodiments, a node 18 may include various components to provide desired functionality. For example switches 42, multiplexers 42, or a combination thereof may be used to receive, switch, and multiplex or demultiplex signals, received from other uphole 140a and downhole 140b nodes 18. The switches/multiplexers 42 may direct traffic such as data packets or other signals into and out of the node 18, and may ensure that the packets or signals are transmitted at proper time intervals, frequencies, or combinations thereof.

In certain embodiments, the multiplexer 42 may transmit several signals simultaneously on different carrier frequencies. In other embodiments, the multiplexer 42 may coordinate the time-division multiplexing of several signals. Signals or packets received by the switch/multiplexer 42 may be amplified 48 and filtered 50, such as to remove noise. In certain embodiments received signals may simply be amplified 48. In other embodiments, the signals may be received, data may be demodulated therefrom and stored, and the data may be remodulated and retransmitted on a selected carrier frequency having greater signal strength. A modem 40 may be used to demodulate digital data from signals received from the switch/multiplexer and modulate digital data onto carrier signals for transfer to the switches/multiplexer for transmission uphole or downhole The modem 40 may also perform various tasks such as error-checking 76 and data compression. The modem 40 may also communicate with a microcontroller 134. The microcontroller 134 may execute any of numerous applications 136. For example, the microcontroller 134 may run applications 136 whose primary function is acquire data from one or a plurality of sensors 44a-c. For example, the microcontroller 134 may interface to sensors 44 such as inclinometers, thermocouplers, accelerometers, imaging devices, seismic data gathering devices, or other sensors such as those listed in the description of FIG. 3. Thus, the node 18 may include circuitry to function as a data acquisition tool.

In other embodiments, the microcontroller 134 may run applications 136 that may control various tools 46 or sensors 44 located downhole. That is, not only may the node 18 be used as a repeater, and as a data gathering device, but may also be used to receive or provide control signals to control selected tools 46 and sensors 44 as needed. The node 18 may also include a volatile memory device 34, such as a FIFO 34 or RAM 34, that may be used to store data needed by or transferred between the modem 40 and the microcontroller 134.

Other components of the node 18 may include nonvolatile memory 36, which may be used to store data, such as configuration settings, node addresses, system settings, and the like. One or several clocks 132 may be provided to provide clock signals to the modem 40, the microcontroller 134, or any other device. A power supply 52 may receive power from an external power source 138 such as batteries. The power supply 52 may provide power to any or all of the components located within the node 18. Likewise, an RS232 port 38 may be used to provide a serial connection to the node circuit 18.

Figure 6:
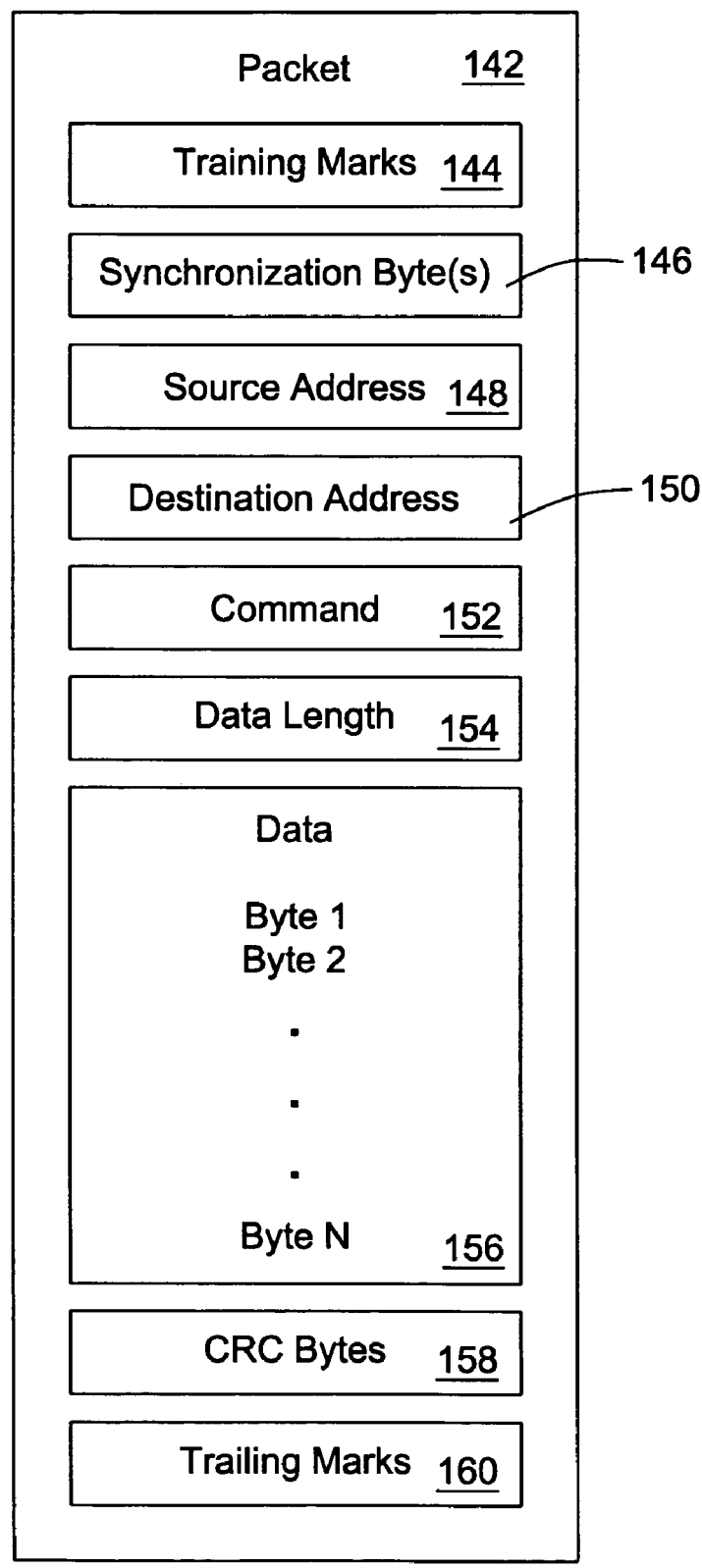
FIG. 6 is a schematic block diagram illustrating one embodiment of a network packet in accordance with the invention.

Thus, the node 18 described in FIG. 6 may provide many more functions than those supplied by a simple signal repeater. The node 18 may provide many of the advantages of an addressable node on a local area network. The addressable node may amplify signals received from uphole 140b or downhole 140a sources, be used as a point of data acquisition, and be used to provide control signals to desired sensors 44 or tools 46. These represent only a few examples of the versatility of the node 18. Thus, the node 18, although useful and functional as a repeater 30, may have a greatly expanded capability.

Referring to FIG. 6, a packet 142 containing data, control signals, network protocols, or the like may be transmitted up and down the drill string 14 through the network 17. For example, in one embodiment, a packet 142 in accordance with the invention may include training marks 144. Training marks 144 may include any overhead, synchronization, or other data needed to enable another node 18 to receive a particular data packet 142.

Likewise, a packet 142 may include one or several synchronization bytes 146. The synchronization byte 146 or bytes 146 may be used to synchronize the timing of a node 18 receiving a packet 142. Likewise, a packet 142 may include a source address 148, identifying the logical or physical address of a transmitting device, and a destination address 150, identifying the logical or physical address of a destination node 18 on a network 17.

A packet 142 may also include a command byte 152 or bytes 152 to provide various commands to nodes 18 within the network 17. For example, commands 152 may include commands to set selected parameters, reset registers or other devices, read particular registers, transfer data between registers, put devices in particular modes, acquire status of devices, perform various requests, and the like.

Likewise, a packet 142 may include data or information 154 with respect to the length 154 of data transmitted within the packet 142. For example, the data length 154 may be the number of bits or bytes of data carried within the packet 142. The packet 142 may then include data 156 comprising a number of bytes. The data 156 may include data gathered from various sensors 44 or tools 46 located downhole, or may contain control data to control various sensors 44 or tools 46 located downhole. Likewise one or several bytes 158 may be used to perform error checking of other data or bytes within a packet 142. Trailing marks 160 may provide any other overhead or synchronization needed after transmitting a packet 142. One of ordinary skill in the art will recognize that network packets 142 may take on many forms and contain varied information. Thus, the example presented herein simply represents one contemplated embodiment in accordance with the invention, and is not intended to limit the scope of the invention.

Figure 7:
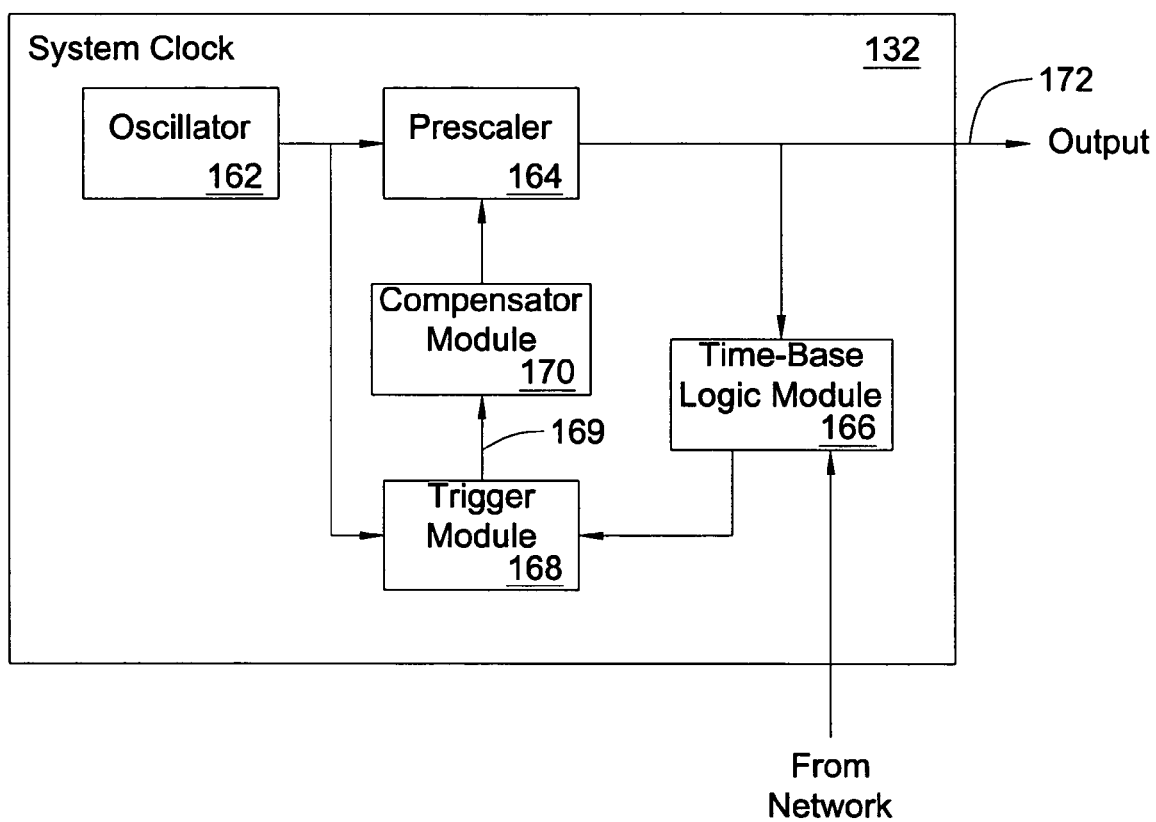
FIG. 7 is a high-level schematic block diagram illustrating one embodiment of a downhole clock in accordance with the invention, wherein the clock is configured to compensate for drift.

Referring to FIG. 7, as was described in the background section of the present application, synchronizing the time of downhole clocks is an important concern. Some downhole tools or sensors, such as seismic devices, require that data be precisely time-stamped to be useful. Although the clocks 132 of various downhole nodes 18 may be periodically synchronized through the network 17, these clocks 132 must remain synchronized. Thus, clocks 132 are needed that remain accurate and compensate for drift, even in harsh downhole environments.

In selected embodiments, a clock 132 in accordance with the present invention may include an oscillator 162 that creates a series of pulses at a rated frequency. Most oscillators 162 exhibit some frequency instability that can cause drift over a period measured in seconds, minutes, hours, etc. Many crystal oscillators 162 experience drift caused by a shift in frequency as a function of temperature. Thus, in downhole environments, where temperatures can be very high, the frequency fluctuation of oscillators 162 may be significantly more pronounced that it would be above the surface.

An oscillator 162 may be operably connected to a prescaler 164. Generally, a prescaler 164 is configured to generate a "clock" pulse after it has received a certain number of input pulses from the oscillator 162. For example, a "Divide-by-N" prescaler 164 will generate a clock pulse after it has received N input pulses. In other words, the prescaler 164 divides the oscillator output by a divisor, N. Presently, there are prescalers 164 that are capable of accepting a range of frequencies ranging from a few hundred Megahertz to a few Gigahertz. The basic objective of a prescaler 164 is to provide a series of clock pulses to a larger, slower counter by dividing a higher incoming pulse frequency. Although some prescalers 164 are designed to perform high speed counting, many have little or no counting features since this may hinder a prescaler's operating speed.

The output 172 from the prescaler may form the basis for a downhole clock 132. The clock 132 may also include a time-base logic module 166. The time-base logic module 166 may be responsible for keeping time based on the output from the prescaler 164. This time may be periodically compared to a reference time obtained through the network. By comparing these two times, the drift of the clock 132 may be calculated. Measuring drift may be as simple as subtracting the clock's time from the reference time. This drift may be measured over a period of seconds, minutes, or hours, in order to get a measurable value of the drift. In selected embodiments, the drift may be measured in parts per million (ppm), which expresses the drift in terms of a number of errant pulses for every million pulses. For example, if the drift is measured at 200 ppm, then the clock pulse has drifted from the reference time by 200 pulses for every million pulses output. Once this error rate, or drift, is calculated, this number may be used to take appropriate corrective or compensative action.

The time-base logic module 166 may be operably connected to a trigger module 168. The trigger module 168 may be programmed to send a trigger signal 169 at calculated intervals to modify the divisor settings of the prescaler 164. For example, depending on time drift, it may be determined that a correction needs to be made after every 80,000 pulses from the oscillator 162. Thus, the trigger module 168 may be configured to monitor the oscillator 162 and send a trigger signal 169 each time 80,000 pulses are output by the oscillator 162. In selected embodiments, the trigger module 168 is simply a counting circuit that counts 80,000 pulses before sending a trigger signal 169.

The trigger signal 169 may be received by a compensator module 170. The compensator module 170 may be configured to load a divisor value into the prescaler 164. For example, if the prescaler 164 normally waits for 16 pulses from the oscillator 162 before outputting a clock pulse, the compensator module 170 may increase or reduce this number. This may have the effect of advancing or retarding the timing of the output 172. In selected embodiments, the compensator module 170 simply changes the divisor number loaded into the prescaler 164 for a single cycle. For example, if the prescaler 164 normally waits for 16 oscillator pulses before outputting a clock pulse, the compensator module 170 may reprogram the prescaler to wait 17 oscillator pulses before outputting a clock pulse for one cycle, and then return to the normal operating mode of waiting for 16 pulses. Thus, the compensation module 170 may temporarily change the divisor number that is loaded into the prescaler 164 to either advance or retard the timing of the output 172.

Figure 8:
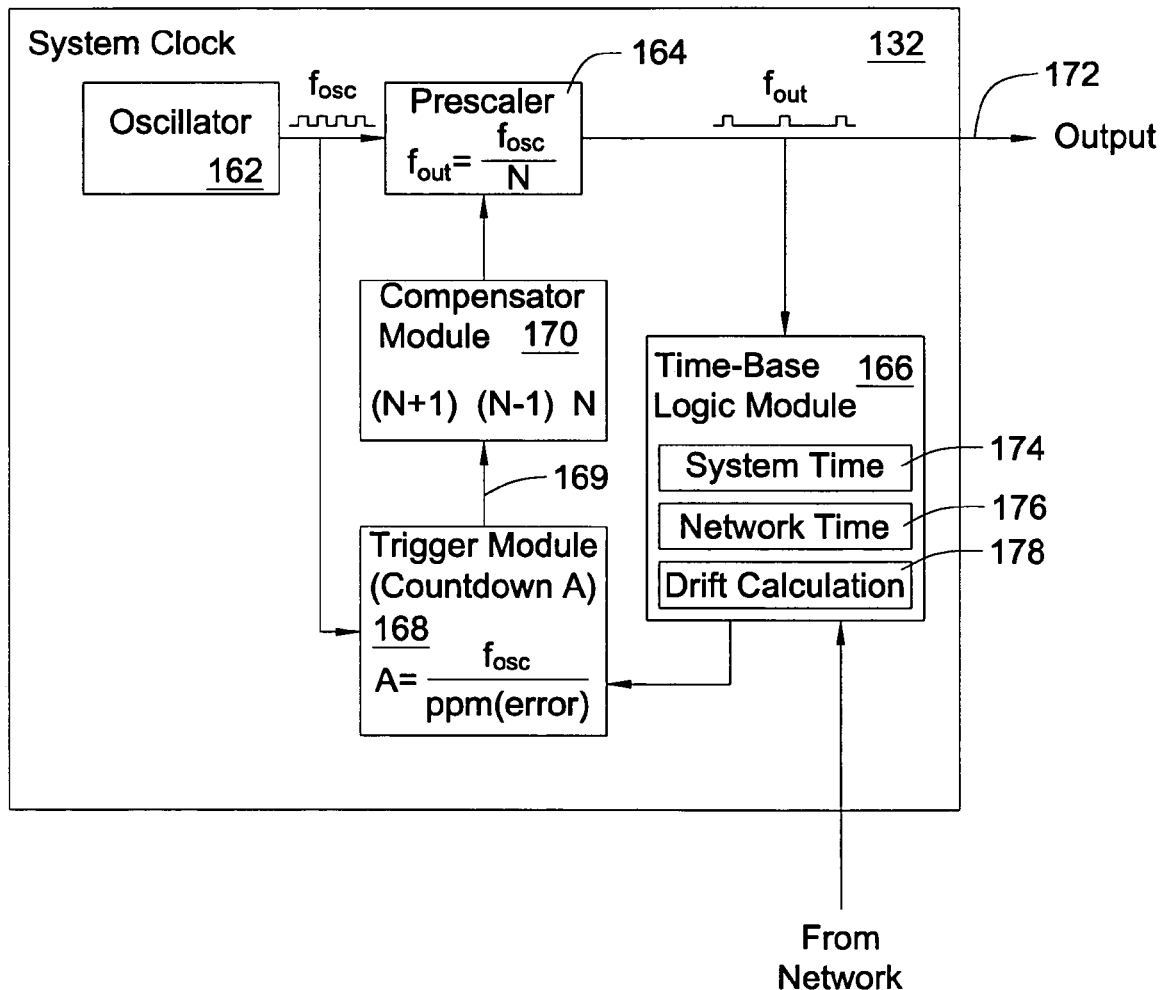
FIG. 8 is a schematic block diagram illustrating a more detailed embodiment of a downhole clock in accordance with the invention.

Referring to FIG. 8, for example, an oscillator 162 may produce an output frequency $f_{osc}$. The prescaler 164 may divide the oscillator frequency $f_{osc}$ by N to produce an output frequency $f_{out}$. The output frequency $f_{out}$ may be monitored by the time-base logic module 166 to maintain a system time 174. The time-base logic module 166 may also periodically receive a reference time 176 such as the network time 176 via the network 17. This network time 176 may or may not be adjusted to compensate for transmission delay in the network 17. The time-base logic module 166 may also periodically synchronize the system time 174 with the network time 176. The time-base logic module 166 may also be responsible for drift calculation 178. The drift may be calculated by comparing the network time 176 with the system time 174 to determine how much the system time 174 has deviated or drifted from the network time 176 over a selected time period. In selected embodiments, the drift calculation 178 may be expressed in terms of an errant number of pulses per million (ppm).

Once the drift is calculated, an adjustment rate (A) may be calculated to determine how often the trigger module 168 should send out a trigger signal 169. For example, if the drift is 200 ppm, then the adjustment rate (A) may be calculated by dividing the oscillator frequency $f_{osc}$ by 200 ppm. If the oscillator frequency $f_{osc}$ is 16 Mhz, then the adjustment rate (A) would be 80,000. This means that for every 80,000 pulses output by the oscillator 162, the trigger module 168 would output a trigger signal 169.

The trigger signal 169 triggers the operation of the compensator module 170. The compensator module 170 loads a value of N+1, N−1, or N into the prescaler 164. If the clock 132 needs to be advanced, then the compensator module 170 loads N−1 into the prescaler 164. Likewise, if the clock 132 needs to be retarded, the compensator module 170 loads N+1 into the prescaler 164. In this example, the values of N+1 and N−1 are only loaded into the prescaler 164 for a single cycle. That is, once the prescaler 164 outputs a clock pulse, after counting to either N+1 or N−1, the compensator module 170 reloads N into the prescaler 164. Thus, by periodically loading N+1 or N−1 into the prescaler 164, the clock 132 may be advanced or retarded and thereby compensate for drift.

In an alternative embodiment, the trigger module 168 monitors $f_{out}$ instead of $f_{osc}$. In this case, the adjustment rate (A) is calculated by dividing $f_{out}$ by the drift measured in parts per million (ppm). For example if the drift is 200 ppm, then the adjustment rate (A) would be $f_{out}$ divided by 200 ppm. The trigger module 168 would then monitor $f_{out}$ and output a trigger signal 169 every time (A) pulses are output by the prescaler 164.

Figure 9:
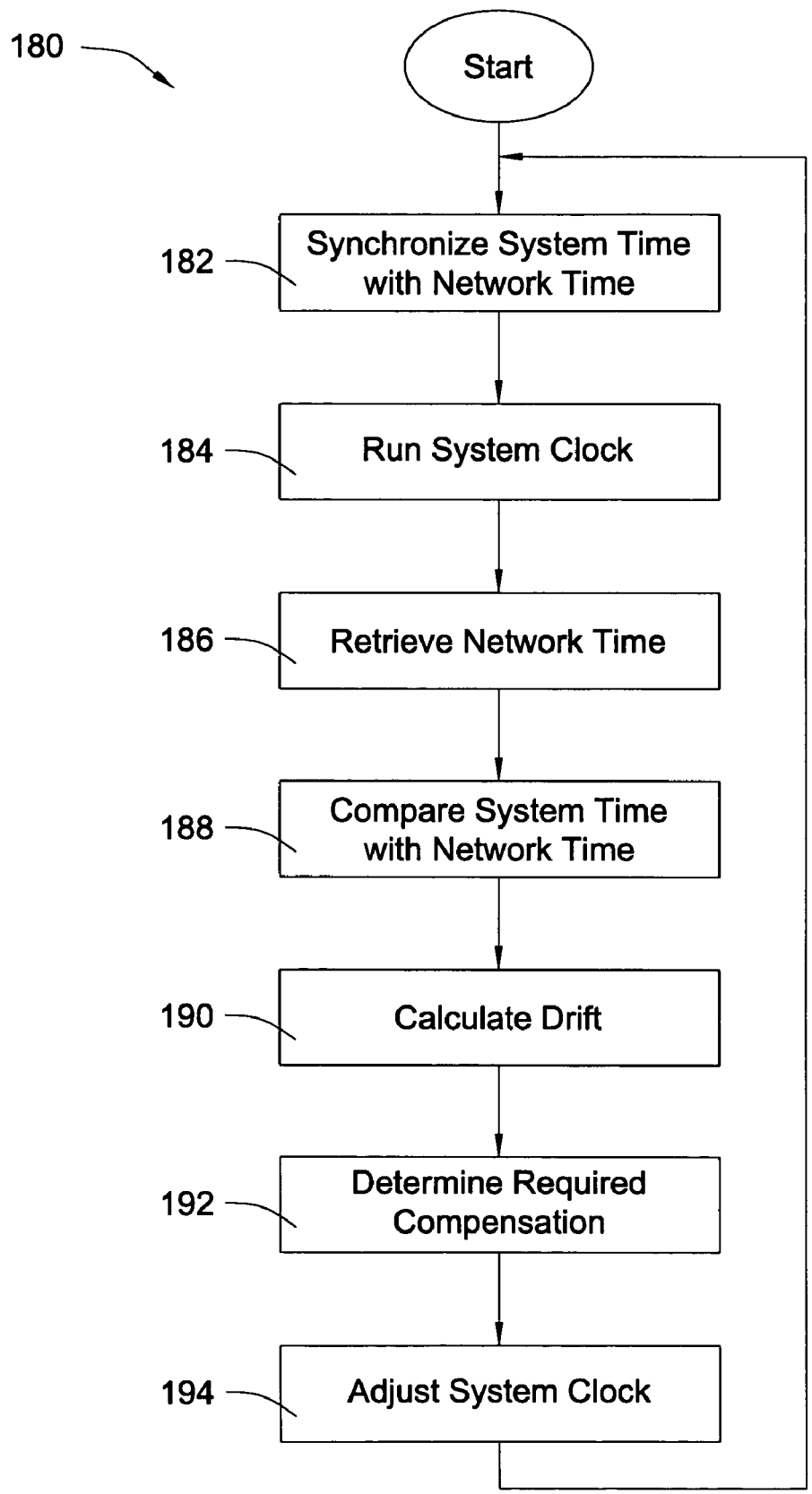
FIG. 9 is a flow chart illustrating one embodiment of a time synchronization process in accordance with the present invention.

Referring to FIG. 9, in one embodiment, a process 180 in accordance with the present invention includes synchronizing 182 the system time of a downhole clock with the network time. This step 182 may ensure that initially all network clocks, including the primary time server and downhole components, are synchronized and are starting to keep time from a common reference point. Alternatively, the system time may be synchronized with a reference time obtained from a source such as a GPS device or a radio station.

The process may include running 184 the system clock for a sufficient enough period to attain some measurable amount of drift. After this period has passed, the network time may again be retrieved 186 and compared 188 with the system time. From this comparison, a drift measurement may be calculated 190. This drift measurement may then be used to determine 192 the compensation needed to correct the drift. Once the compensatory action is determined 192, the system clock may then be adjusted 194 to compensate for the drift.

Figure 10:
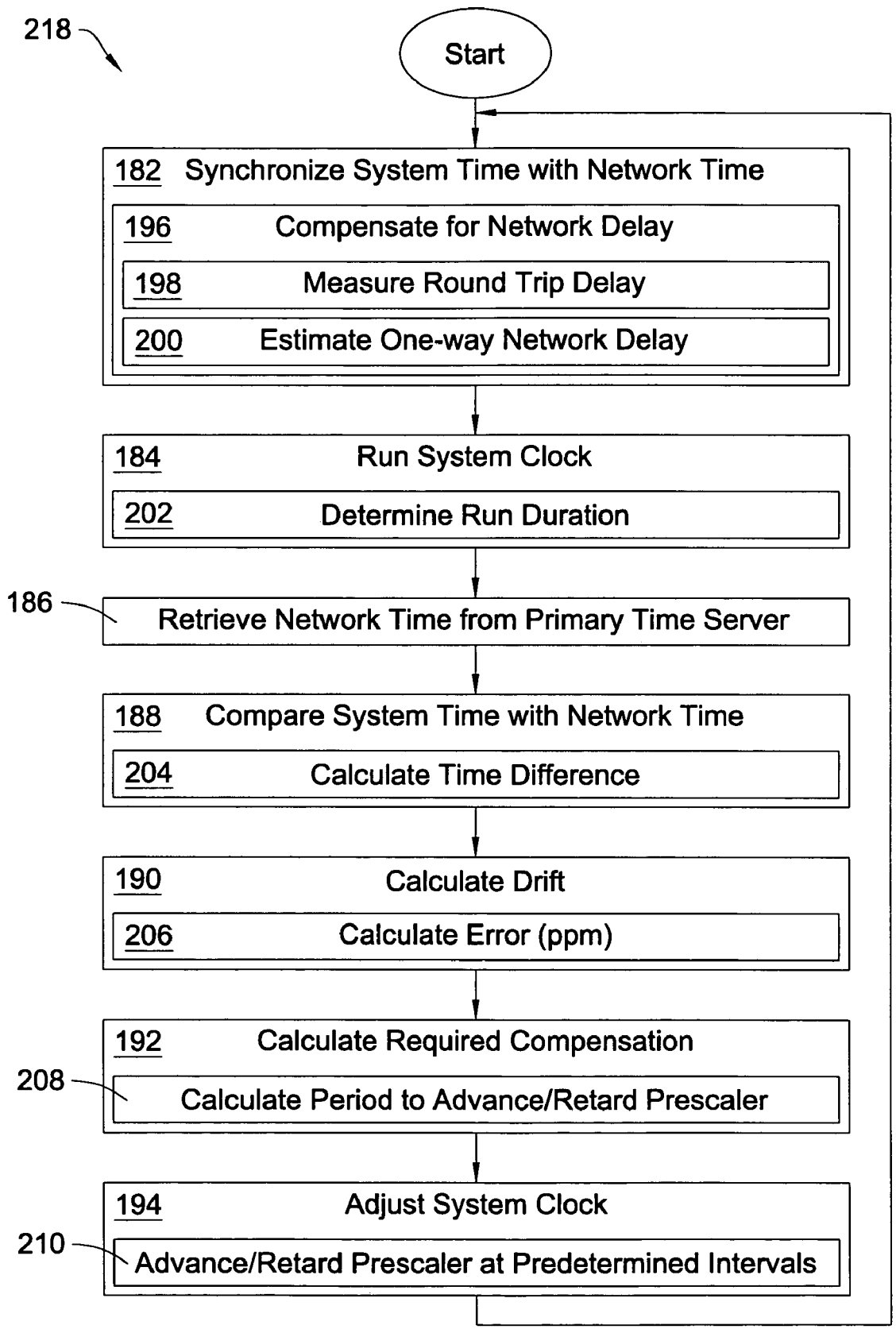
FIG. 10 is a flow chart illustrating a more detailed embodiment of a time synchronization process in accordance with the present invention.

Referring to FIG. 10, more specifically, a process 218 in accordance with the invention may include synchronizing 182 the system time with a network or other reference time source. This synchronization step 182 may include compensating 196 for network delay. Because network delay may be significant, a reference time measurement obtained over the network may not be totally accurate. In certain embodiments, a process 180 may compensate 196 for network delay by measuring 198 the round trip delay in the network. For example, a signal or packet may be sent from a downhole device to a network server, which may in turn return the signal to the downhole component. The total trip time may be measured 198 and a one-way delay value may be estimated 200. This may be done by simply dividing the round trip time by two or by using some other averaging or estimating technique, as needed.

The process 218 may then include running 184 the system clock for some appreciable time until there is some measurable drift. This may include determining 202 some run duration, which may be a period of second, minutes, hours, or the like. In selected embodiments, the run duration may adjusted as needed according to various parameters, including but not limited to the rate of change (or derivative) of the drift, the rate of temperature change downhole, the stability of the oscillator frequency, or the like.

The process 218 may then include retrieving 186 a reference time, such as from the network's primary time server. As was previously mentioned, a reference time may also be retrieved from any other suitable source, as needed. Once the reference time is retrieved 186, the system time may then be compared 188 with the reference time. This may as simple as subtracting the system time from the reference time (i.e. calculating 204 the difference). Once this comparison 188 is made, the drift may then be calculated 190. As was mentioned herein, the drift may be expressed in any suitable terminology, including but not limited to calculating 206 the error in parts per million (ppm).

Once the drift is calculated 190, a process 218 may include calculating 192 the required compensation. In devices utilizing an oscillator 162 and a prescaler 164, as described with respect to FIGS. 7 and 8, this may include calculating 208 the period to advance or retard the prescaler 164. For example, calculating 208 the period may include determining that the prescaler 164 needs to be adjusted (i.e. advanced or retarded) for every 80,000 pulses that are output by the oscillator 162. Once the required compensation is calculated 192, the system clock may be adjusted 194. In clocks 132 using an oscillator 162 and prescaler 164 combination, this may include advancing or retarding the prescaler 164 at calculated intervals by changing the number (N) loaded into the prescaler 164.

The present invention may be embodied in other specific forms without departing from its essence or essential characteristics. The described embodiments are to be considered in all respects only as illustrative, and not restrictive. The scope of the invention is, therefore, indicated by the appended claims, rather than by the foregoing description. All changes within the meaning and range of equivalency of the claims are to be embraced within their scope.

What is claimed is:

1. A method for compensating for frequency drift in a downhole system clock, comprising the steps of:
   providing a downhole clock system comprising an oscillator which generates pulss subject to a drift in frequency due to downhole environmental changes;
   sending pulses from the oscillator to a prescaler and a trigger module;
   comparing time pulses from the prescaler with a surface clock in a time base logic module and generating error values by the time base logic module;
   outputting the error values to the trigger module;
   recieveing error values from the time-base logic module by the trigger module;
   providing divisors to the prescaler by the trigger module sending signals at calculated intervals depending on the frequency drift to a compensator module which which sends a valve into the prescaler; and
   outputting by the prescaler corrected time pulses based off of the divisors provided by the trigger and compensator module.

2. The method of claim 1, wherein the time based logic module is in communication with surface clock over a downhole network.

3. The method of claim 2, wherein the clock system also compensates for latency in the downhole network.

4. The method of claim 1, wherein the surface clock is hosted by a device selected from the group consisting of a network server, a network node, a GPS device, and a time-broadcasting ratio station.

5. The method of claim 1, wherein the frequency drift is measured in seconds, minutes, hours, or parts per million.

6. The method of claim 1, wherein the outputting is advanced or retarded based off of the divisor.

7. The method of claim 1, wherein the method further includes a step comprising triggering the opertation of the compensator module by the trigger module.

8. The method of claim 1, wherein the surface clock and the corrected time pulses are synchronized.

9. The method of claim 1, wherein the amount of drift is exacerbated by downhole temperatures.

10. The method of claim 1, wherein the frequency drift is calculated in terms of a number of errant pulses by a total number of pulses.

11. A drift-compensated downhole system clock, the clock comprising an oscillator which generates pulses subject to a drift in frequency due to downhole environmental changes and sends the pulses to a prescaler and a trigger module,
   the prescaler outputs corrected time pulses by making selective division of the pulses from the oscillator,
   the trigger module receives error values from a time based logic module, to provide divisors to a prescaler through the compensator module for the selective divisions,
   the time based logic module compares the corrected time pulses from the prescaler to a surface clock and outputs the error values to the trigger module;
   whereby the drift-compensated downhole system clock continuously provides the corrected time pulses from the time prescaler which are compendated for the frequency drift
   wherein the time based logic module is in communication with surface clock over a downhole network.

12. The system clock of claim 11, wherein, wherein the clock system also compensates for latency in the downhole network.

13. The system clock of claim 11, wherein the surface clock is hosted by a device selected from the group consisting of a network server a network node, a GPS device, and a time-broadcasting ratio station.

14. The system claim of claim 11, whrein the frequency drfit is measured in seconds, minutes, hours, or parts per million.

15. The system clock of claim 11, wherein the trigger module, in cooperation with the compensator module, retards or advances the prescaler's outputs.

16. The system clock of claim 11, wherein the trigger module triggers the operation of the compensators module.

17. The system clock of claim 11, wherein the surface clock and the downhole clock system are synchronized.

18. The system clock of claim 11, wherein the amount of drift is exacerbated by downhole temperatures.

19. The system clock of claim 11, wherein the frequency drift is calculated in terms of a number of errant pulses in a total number of pulses.

* * * * *